(12) United States Patent
Chou (10) Patent No.: US 8,663,783 B2
(45) Date of Patent: Mar. 4, 2014

(54) THIN-FILM LAYER STRUCTURE AND METHOD FOR MANUFACTURING SAME

(75) Inventor: Ching-Yu Chou, Hsinchu (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 818 days.

(21) Appl. No.: 11/781,513

(22) Filed: Jul. 23, 2007

(65) Prior Publication Data

US 2008/0090058 A1    Apr. 17, 2008

(30) Foreign Application Priority Data

Oct. 11, 2006   (TW) ............................... 95137336 A (51) Int. Cl.
*B41M 5/00* (2006.01)
(52) U.S. Cl.
USPC ............. 428/195.1; 428/1.1; 428/212; 430/7; 359/885; 359/891; 349/106
(58) Field of Classification Search
USPC ............. 428/1.1, 212, 195.1; 349/106; 430/7; 359/885, 891
See application file for complete search history.

(56) References Cited

U.S. PATENT DOCUMENTS

| | | | |
|---|---|---|---|
| 5,763,139 A * | 6/1998 | Matsunaga et al. | 430/313 |
| 6,008,582 A * | 12/1999 | Asano et al. | 313/582 |
| 6,428,945 B1 * | 8/2002 | Lin et al. | 430/321 |
| 2003/0001992 A1 * | 1/2003 | Kawase et al. | 349/106 |
| 2005/0029943 A1 * | 2/2005 | Irie et al. | 313/582 |
| 2005/0156176 A1 * | 7/2005 | Gupta et al. | 257/79 |
| 2005/0285523 A1 * | 12/2005 | Fujitani | 313/582 |
| 2007/0182775 A1 * | 8/2007 | Kurita et al. | 347/15 |

FOREIGN PATENT DOCUMENTS

| | | |
|---|---|---|
| JP | 8327817 | 12/1996 |
| JP | 200089023 | 3/2000 |
| JP | 2000187111 | 7/2000 |
| JP | 2003066220 | 3/2003 |
| JP | 2003121635 | 4/2003 |
| JP | 2005078052 | 3/2005 |

* cited by examiner

*Primary Examiner* — Gwendolyn Blackwell
*Assistant Examiner* — Ruiyun Zhang
(74) *Attorney, Agent, or Firm* — The Altis Law Group, Inc.

(57) ABSTRACT

A thin-film layer structure (100) includes a substrate (102), a plurality of banks (104) with a roughly same height formed on the substrate, and a plurality of thin-film layers (106). The plurality of banks defines a plurality of spaces therein, and the plurality of spaces is arranged in rows and columns. A volume distribution of the plurality of spaces receiving the thin-film layers made of a same material in each row is irregular. A method for manufacturing a thin-film layer structure is also provided.

5 Claims, 11 Drawing Sheets

THIN-FILM LAYER STRUCTURE AND METHOD FOR MANUFACTURING SAME

CROSS-REFERENCE TO RELATED APPLICATIONS

This application is related to commonly-assigned copending application Ser. No. 11/309,934, entitled "THIN-FILM LAYER STRUCTURE AND METHOD FOR MANUFACTURING SAME". Disclosure of the above-identified application is incorporated herein by reference.

BACKGROUND OF THE INVENTION

1. Technical Field

The present invention generally relates to a thin-film layer structure and a method for manufacturing the thin-film layer structure on a substrate.

2. Description of the Related Art

At present, methods for manufacturing a thin-film layer structure on a substrate include a photolithographic method and an ink-jet method.

The photolithographic method is described as below: applying a photo-resist layer on a substrate; exposing the photo-resist layer using a photo mask with a predetermined pattern and developing the exposed photo-resist layer to form a predetermined thin-film layer structure. Thus a large part of the photo-resist material is wasted and the efficiency is low. This increases costs.

The ink-jet method uses an ink-jet device with a number of nozzles for depositing ink into a predetermined position on a substrate structure. A thin-film layer structure is formed after solidifying the ink. Generally, since an area of the substrate structure is larger than a coverage area of the nozzles, the nozzles of the ink-jet device need to move in a grid pattern relative to the substrate structure to finish depositing the ink on the substrate structure.

In a conventional thin-film layer structure formed by the ink-jet method, thin-film layers made of same material in a same row are deposited by a same nozzle, and thicknesses of the such thin-film layers are essentially identical. Therefore, uniformity of the thin-film layers of the same material in each row is high. However, the thin-film layers made of same material in different row are deposited by different nozzles such that thicknesses of the such thin-film layers are different. Therefore, non-uniformities of the thin-film layers between different rows are easily identified by a test operator when light passes therethrough, and linear Mura defects are formed.

What is needed, therefore, is a thin-film layer structure with few or no Mura defects and a method for manufacturing the same.

SUMMARY OF THE INVENTION

A thin-film layer structure according to one preferred embodiment includes a substrate, a plurality of banks with a roughly same height formed on the substrate, and a plurality of thin-film layers. The plurality of banks defines a plurality of spaces therein, and the plurality of spaces are arranged in rows and columns. A volume distribution of the plurality of spaces receiving the thin-film layers made of a same material in each row is irregular.

A method for manufacturing a thin-film layer structure according to another preferred embodiment is provided. The method includes: providing a substrate with a plurality of banks thereon, the plurality of banks has a roughly same height defining a plurality of spaces therein, the plurality of spaces arranged in rows and columns with an irregular volume distribution; depositing a same quantity of ink into the spaces such that the ink of a same material deposited in the spaces in each row have an irregular thickness distribution; and solidifying the ink so as to form a plurality of thin-film layers formed in the spaces such that the thin-film layers made of the same material in each row have an irregular thickness distribution.

A method for manufacturing a thin-film layer structure according to further another preferred embodiment is provided. The method includes: providing a substrate and forming a photo-resist layer on the substrate; setting a photo mask between the photo-resist layer and an exposure machine configured for exposing the photo-resist layer, the photo mask has a predetermined irregular pattern corresponding to a plurality of banks; developing the unexposed portions of the photo-resist layer to form the plurality of banks, the plurality of banks defining a plurality of spaces therein, the plurality of spaces being arranged in rows and columns with an irregular volume distribution; depositing a roughly same quantity of ink into the plurality of spaces in each row have an irregular thickness distribution; and solidifying the ink so as to form a plurality of thin-film layers formed in the spaces such that the thin-film layers made of the same material in each row have an irregular thickness distribution.

Advantages and novel features will become more apparent from the following detailed description of the present thin-film layer structure and its related method, when taken in conjunction with the accompanying drawings.

BRIEF DESCRIPTION OF THE DRAWINGS

Many aspects of the present thin-film layer structure and its related manufacturing method can be better understood with reference to the following drawings. The components in the drawings are not necessarily drawn to scale, the emphasis instead being placed upon clearly illustrating the principles of the present thin-film layer structure and its related manufacturing method. Moreover, in the drawings, like reference numerals designate corresponding parts throughout the several views.

DETAILED DESCRIPTION OF THE INVENTION

Reference will now be made to the drawings to describe preferred embodiments of the present thin-film layer structure and its related manufacturing method, in detail.

Figure 1:
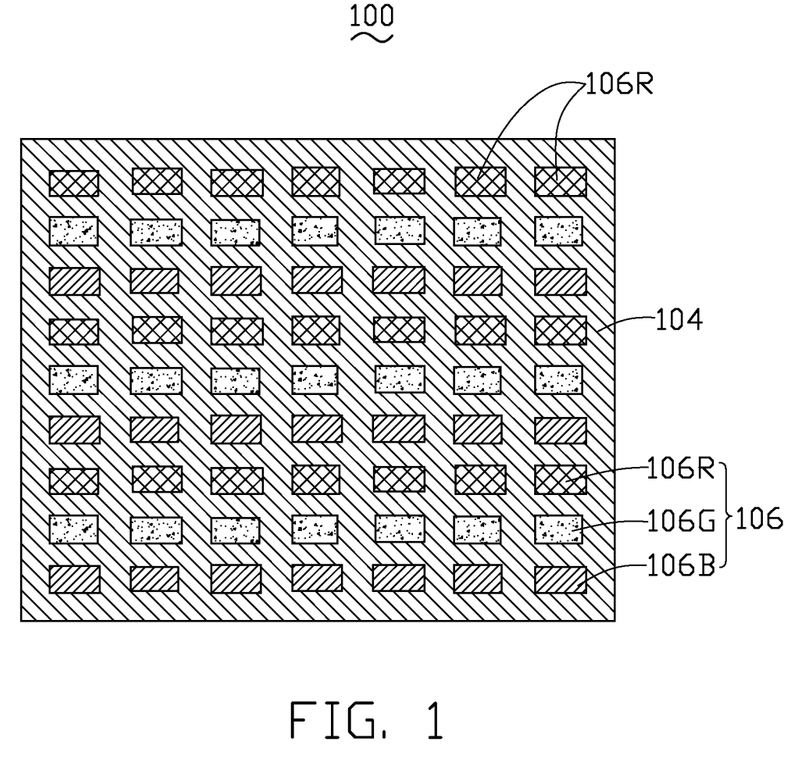
FIG. 1 is a cross-sectional view of a thin-film layer structure in accordance with a first preferred embodiment.
Figure 2:
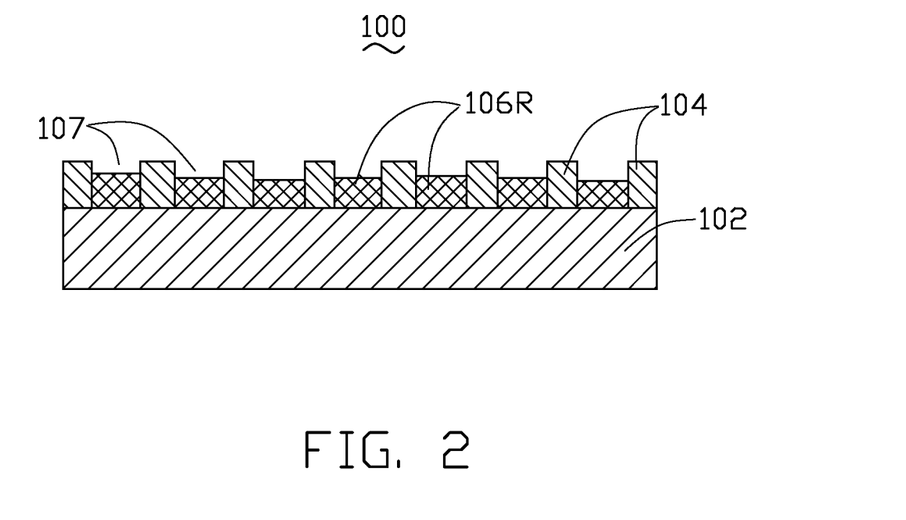
FIG. 2 is another cross-sectional view of a thin-film layer structure, showing a thickness distribution of thin-film layers in one row.

Referring to FIGS. 1 to 2, a thin-film layer structure 100 in accordance with a first preferred embodiment is shown. The thin-film layer structure 100 includes a substrate 102, a plurality of banks 104 with a roughly same height formed on the substrate 102 and a plurality of thin-film layers 106.

A material of the substrate is selected from the group consisting of glass, quartz glass, silicon, metal and plastic. The plurality of banks 104 defines a plurality of spaces 107 therein, and the spaces 107 are arranged in rows and columns on the thin-film layer structure. A volume distribution of the plurality of spaces 107 receiving the thin-film layers made of a same material in each row is irregular.

Referring to FIGS. 1 to 2 again, the plurality of thin-film layers 106 include a plurality of first thin-film layers 106R, second thin-film layers 106G, and third thin-film layers 106B. The plurality of first thin-film layers 106R, second thin-film layers 106G, and third thin-film layers 106B are formed in the spaces 107, and the volume distribution of the spaces 107 receiving the thin-film layers 106 made of the same material in each row is irregular. The volume of each space 107 is in a range from about 80% to about 120% of a standard volume or an average volume of all the spaces 107. The reference standard volume of spaces is a volume that is used in a conventional method for manufacturing a thin-film layer structure, and is generally constant. The thin-film layers 106 repeat the same pattern every three rows to include the first thin-film layers 106R, the second thin-film layers 106G and the third thin-film layers 106B. The volume of each space 107 can be calculated by multiplying the height of the banks 104 and an underside area of each space 107. Since the height of each bank is roughly the same, and the volume distribution of the spaces 107 receiving the thin-film layers 106 made of the same material in each row is irregular, the underside area of each space 107 is irregularly distributed also. That is to say, for example, if a quantity of red ink deposited in the spaces 107 is roughly the same, the thicknesses of adjacent thin-film layers 106R, which are in the same row, may differ. A uniformity of the thin-film layers 106R array in each row is reduced due to an irregular volume distribution of the spaces 107 receiving the thin-film layers 106R. Therefore, a non-uniformity of the thin-film layers 106R array in each row is formed, and linear Mura defects are reduced or avoided when light passes therethrough. The second thin-film layers 106G and the third thin-film layers 106B encounter a similar situation.

Figure 3:
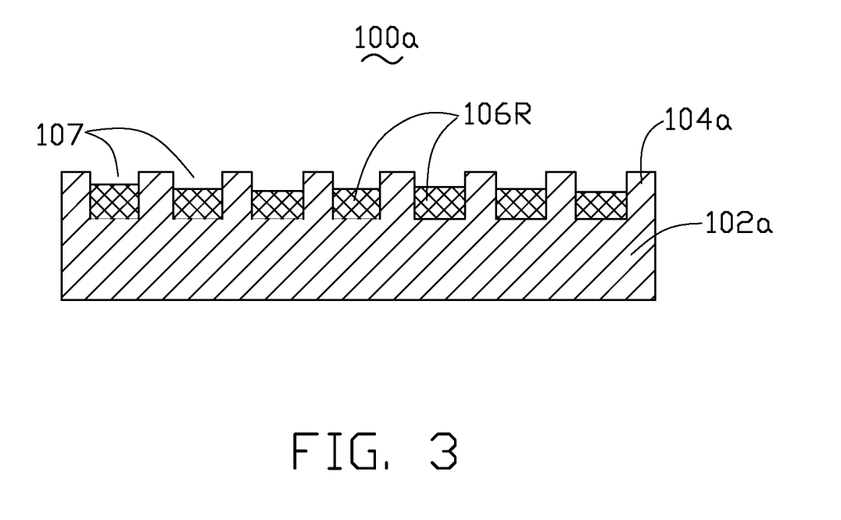
FIG. 3 is a cross-sectional view of a thin-film layer structure in accordance with a second preferred embodiment.

Referring to FIG. 3, a thin-film layer structure 100a according to a second preferred embodiment is shown. The thin-film layer structure 100a of the embodiment is the similar to the thin-film layer structure 100 of the first embodiment, but the substrate 102a of the thin-film layer structure 100a is formed integrally with the plurality of banks 104a.

Figure 4:
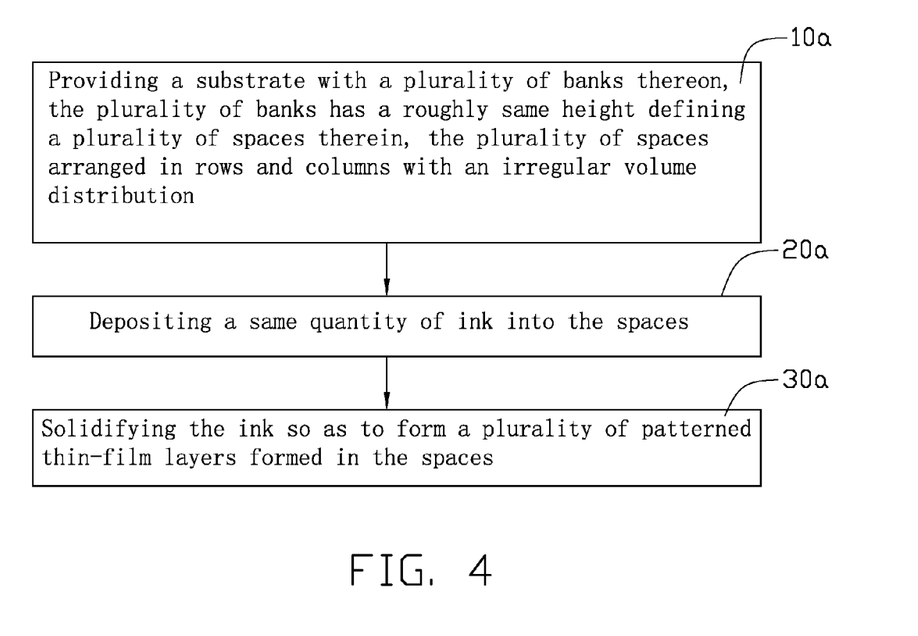
FIG. 4 is a flow chart of a method for manufacturing a thin-film layer structure in accordance with a third preferred embodiment.

Referring to FIG. 4, a flow chart of a method for manufacturing a thin-film layer structure in accordance with a third preferred embodiment is shown. The method mainly includes the steps of: (10a) providing a substrate with a plurality of banks having a roughly same height formed thereon, the plurality of banks defining a plurality of spaces therein, the plurality of spaces arranged in rows and columns with an irregular volume distribution; (20a) depositing a same quantity of ink into the spaces such that the ink of a same material deposited in the spaces in each row has an irregular thickness distribution; (30a) solidifying the ink so as to form a plurality of thin-film layers having an irregular thickness distribution.

In step (10a), a material of the substrate is selected from the group consisting of glass, quartz glass, silicon, metal and plastic. In the preferred embodiment, the substrate is a glass substrate.

Figure 5:
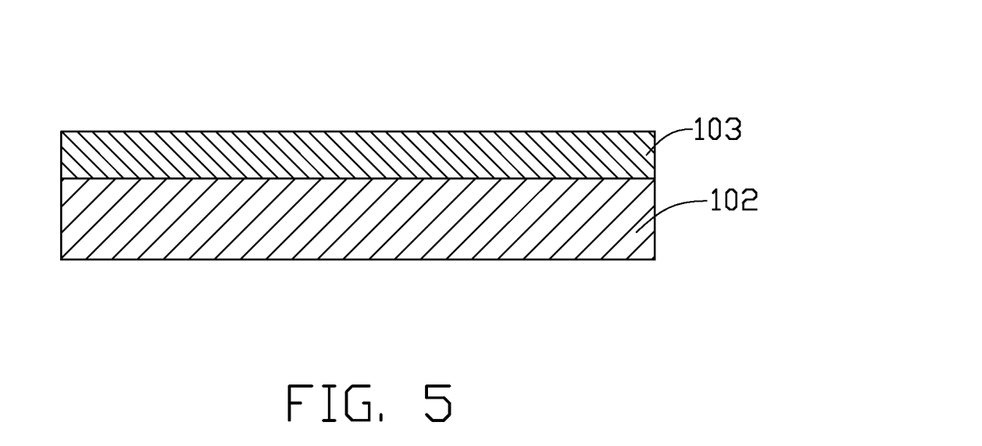
FIG. 5 to FIG. 10 illustrate a manufacturing method of a thin-film layer structure in accordance with the third preferred embodiment.
Figure 6:
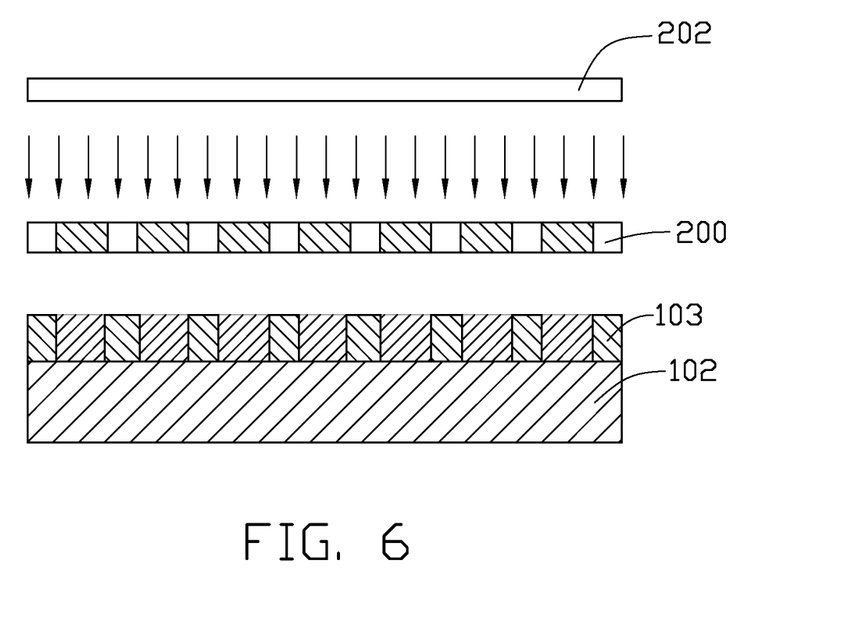
Figure 7:
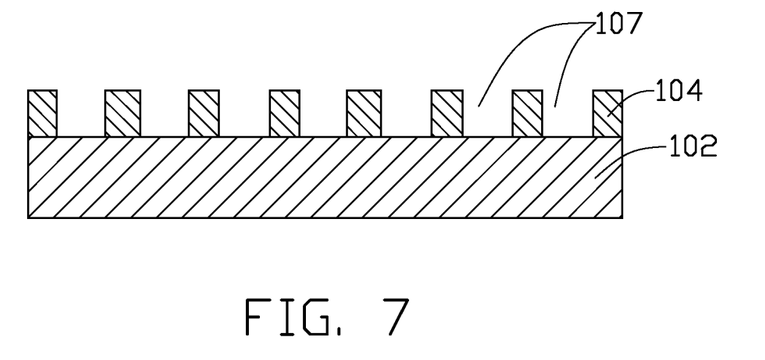

With reference to FIGS. 5 to 7, a method for manufacturing the substrate 102 with the plurality of banks 104 by a photolithography process is described in more detail below.

Referring to FIG. 5, a negative-type photo-resist layer 103 is applied to a surface of the substrate 102 by slit coating, spin coating, slit-spin coating or dry film lamination.

Referring to FIG. 6, the negative-type photo-resist layer 103 is exposed using a photo mask 200 disposed between the negative-type photo-resist layer 103 and a light-exposure device 202. The photo mask 200 has a predetermined irregular pattern corresponding to the thin-film layers 106. The light-exposure device 202 may be an ultraviolet light source.

Referring to FIG. 7, the unexposed parts of the negative-type photo-resist layer 103 is removed by a developing process to form an irregular patterned photo-resist layer serving as the plurality of banks 104. Accordingly, the plurality of spaces 107 with an irregular volume distribution is formed. The volume of each space 107 is in a range from about 80% to about 120% of a standard volume or an average volume of all the spaces 107.

Alternatively, the photo-resist layer can be a positive-type photo-resist layer. Correspondingly, exposed parts of the positive-type photo-resist layer are removed after being developed.

Figure 11:
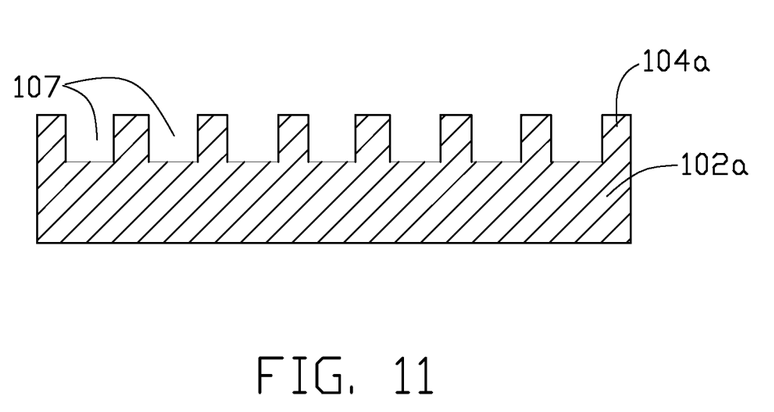
FIG. 11 is a cross-sectional view of a substrate in accordance with a third preferred embodiment; and Corresponding reference characters indicate corresponding parts throughout the drawings. The exemplifications set out herein illustrate at least one preferred embodiment of the present thin-film layer structure and its related method, in one form, and such exemplifications are not to be construed as limiting the scope of the invention in any manner.

In addition, the plurality of banks 104 and the substrate 102 may also be integrally molded using an injection molding process, as shown in FIG. 11, for example, a mold insert with a predetermined irregular pattern corresponding to the thin-film layers 106 received into a mold. A molten material of the substrate is injected into the mold. After being cooled, the molded substrate is removed and provided with the plurality of banks. Accordingly, the plurality of spaces 107 with an irregular volume distribution is formed.

Figure 8:
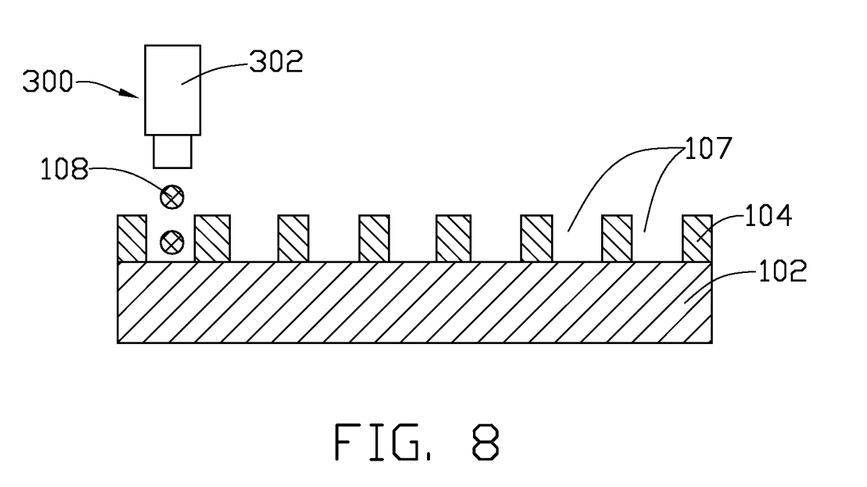
Figure 9:
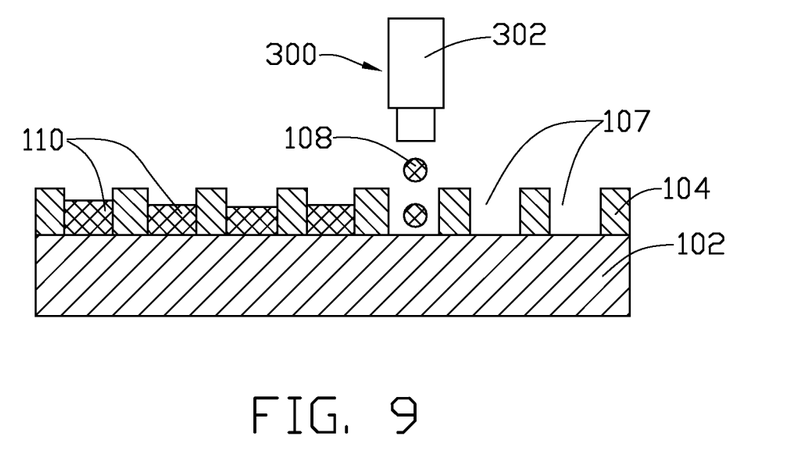

Referring to FIGS. 8 to 9, in step (20a), a same quantity of ink 108 of a desired material is deposited into the spaces 107 to form ink layers 110 using an ink-jet device 300 including at least one ink-jet head 302. The ink-jet device 300 can be either a thermal bubble ink-jet device or a piezoelectrical ink-jet device.

During use of the ink-jet device 300, a relative movement between the ink-jet head 302 and the substrate 102 is performed so as to finish depositing the ink 108 in the plurality of spaces 107.

Referring to FIGS. 8 to 9 again, ink 108 is selected from the group consisting of a first thin-film material, a second thin-film material and a third thin-film material, and the ink 108 deposited into the spaces 107 in every three rows includes ink of the first thin-film material, ink of the second thin-film material, and ink of the third thin-film material arranged in a regular repeating order.

Figure 10:
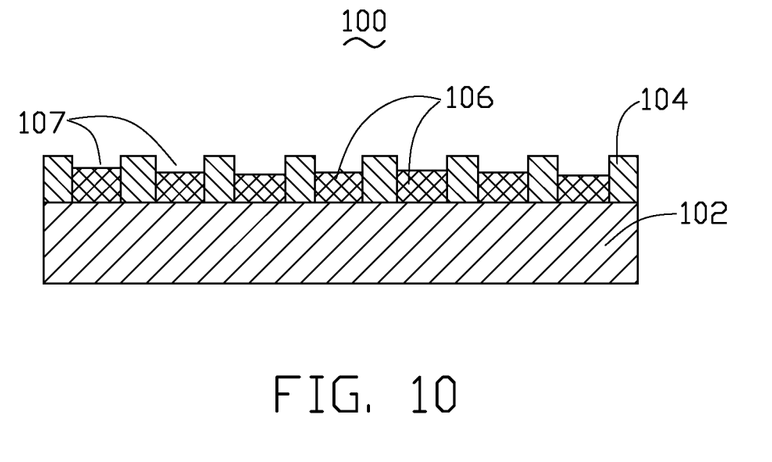

Referring to FIG. 10, in step (30a), the ink layers 110 in the spaces 107 are solidified by a solidifying device (not shown), such as a heating device or an ultraviolet light source. As a result a plurality of thin-film layers 106 are formed in the spaces 107 in a manner such that the thin-film layers 106 in each row are made of a same material but an irregular thickness distribution, and the thin-film layers 106 in every three rows comprise the first thin-film layers 106R, the second thin-film layers 106G and the third thin-film layers 106B arranged in a regular repeating order. A heating device and a vacuum-pumping device can also be used for solidifying the ink layers 110 in the spaces 107 defined by the banks 104. Due to the irregular volume distribution of the spaces 107, a thickness distribution of the formed same thin-film layers 106 made of a same material in each row is irregular after solidifying the ink layers 110. Therefore, a non-uniformity of the thin-film layers 106 array made of a same material in each row is formed, and linear Mura defects are reduced or avoided when light passes therethrough. A thin-film layer structure 100 is formed as shown in FIG. 2.

In addition, the banks 104 themselves formed by the photolithography process can also be removed using a remover such as a stripper after solidifying the ink to form a thin-film layer structure.

The volume distribution of the ink layers 110 of a same material deposited in the spaces 107 in each row is irregular thereby forming an irregular thickness distribution of the thin-film layers 106 made of a same material in each row. Therefore, a non-uniformity of the thin-film layers 106 array made of a same material in each row is formed, and linear Mura defects are reduced or avoided.

It should be noted that the thin-film layer structure can be used in devices such as, color filters and organic light emitting display devices. The method for manufacturing the thin-film layer structure can be used to manufacture the above-mentioned devices. In the manufacturing of color filters, the method can be used to manufacture RGB (red, green, and blue) color layers. Correspondingly, the banks mentioned above can include single layer banks (using black matrix only as the bank), or multi-layer banks (using black matrix and one or more top layers on the black matrix as the bank). This method can also be used to manufacture, for example, emission-material layers, electron-transfer layers, hole-transfer layers and electron-ejection layers.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A thin-film layer structure comprising:
 a substrate;
 a plurality of banks with a substantially identical height formed on the substrate, the banks cooperatively defining a plurality of spaces therein, the spaces being arranged in rows and columns, the spaces in each row having different underside areas aligned in the substrate, the banks made of photo-resist material; and
 a plurality of thin-film layers received in the spaces being made of ink, the thin-film layer in each space having a same thickness, and the thin-film layers received in the spaces in each row having a same material in one color and an irregular thickness distribution, and materials of the thin-film layers received in the spaces in every three rows being different from each other, the thin-film layers received in the spaces of each row in a same row having the irregular thickness distribution, wherein the thin-film layer in the same row is being deposited by a same nozzle of an ink jet head upon performing a relative movement along the same row between the ink jet head and the substrate.

2. The thin-film layer structure as claimed in claim 1, wherein a material of the substrate is selected from the group consisting of glass, quartz glass, silicon, metal and plastic.

3. The thin-film layer structure as claimed in claim 1, wherein the thin-film layers received in the spaces in each column comprise first thin-film layers, second thin-film layers, and third thin-film layers, the first thin-film layers, the second thin-film layers, and the third thin-film layers being arranged in a regular repeating order.

4. The thin-film layer structure as claimed in claim 1, wherein the substrate is formed integrally with the banks.

5. The thin-film layer structure as claimed in claim 1, wherein the volume of each space is in a range from about 80% to about 120% of an average volume of the spaces.

* * * * *